(12) United States Patent
Chen

(10) Patent No.: US 7,210,946 B2
(45) Date of Patent: May 1, 2007

(54) ELECTRONIC DEVICE WITH EMI SHIELD

(75) Inventor: Chun-Hung Chen, Tu-cheng (TW)

(73) Assignee: Hon Hai Precision Industry Co., Ltd., Tu-Chen, Taipei Hsien (TW)

( * ) Notice: Subject to any disclaimer, the term of this patent is extended or adjusted under 35 U.S.C. 154(b) by 0 days.

(21) Appl. No.: 11/376,443

(22) Filed: Mar. 15, 2006

(65) Prior Publication Data

US 2006/0240711 A1 Oct. 26, 2006

(30) Foreign Application Priority Data

Apr. 26, 2005 (CN) ............ 2005 1 0034473

(51) Int. Cl.
*H01R 13/648* (2006.01)
(52) U.S. Cl. ............ 439/92; 439/95; 361/818
(58) Field of Classification Search ........... 439/607, 439/92, 95; 361/800, 816, 818; 174/372
See application file for complete search history.

(56) References Cited

U.S. PATENT DOCUMENTS

| | | | | |
|---|---|---|---|---|
| 4,823,235 A | * | 4/1989 | Suzuki et al. | 361/816 |
| 6,231,356 B1 | * | 5/2001 | Stutts et al. | 439/92 |
| 6,490,173 B2 | * | 12/2002 | Perkins et al. | 361/816 |
| 6,780,030 B2 | * | 8/2004 | Yoshinaga et al. | 439/92 |
| 6,976,856 B2 | | 12/2005 | Peng et al. | |

* cited by examiner

*Primary Examiner*—Michael C. Zarroli
(74) *Attorney, Agent, or Firm*—Morris Manning & Martin LLP; Tim Tingkang Xia, Esq.

(57) ABSTRACT

An electronic device includes a panel, a circuit board, and an EMI shield. The circuit board includes a copper foil electrically connected to earth contacts of the circuit board. The EMI shield electrically connected to the panel includes a tab extending therefrom. The tab is electrically connected to the copper foil of the circuit board.

13 Claims, 2 Drawing Sheets

ELECTRONIC DEVICE WITH EMI SHIELD

BACKGROUND

1. Field of the Invention

The present invention relates to electronic devices, and particularly to an electronic device which can reduce electromagnetic interference (EMI) from a circuit board thereof.

2. General Background

In the enclosure of a typical electronic device, there are generally kinds of electronic components such as Central Processing Units (CPUs) and accelerated chips mounted in a circuit board of the enclosure. The electronic components may emit electromagnetic radiation as operating. The EMI may has a great influence on other components mounted in the enclosure and even may lead to abnormal work of the components.

What is needed is to provide an electronic device which can reduce EMI from a circuit board thereof.

SUMMARY

An exemplary electronic device includes a panel, a circuit board, and an EMI shield. The circuit board includes a copper foil electrically connected to earth contacts thereof. The EMI shield electrically connected to the panel includes a tab extending therefrom. The tab is electrically connected to the copper foil of the circuit board.

Other advantages and novel features of the invention will become more apparent from the following detailed description when taken in conjunction with the accompanying drawings, in which:

DETAILED DESCRIPTION OF THE EMBODIMENT

Figure 1:
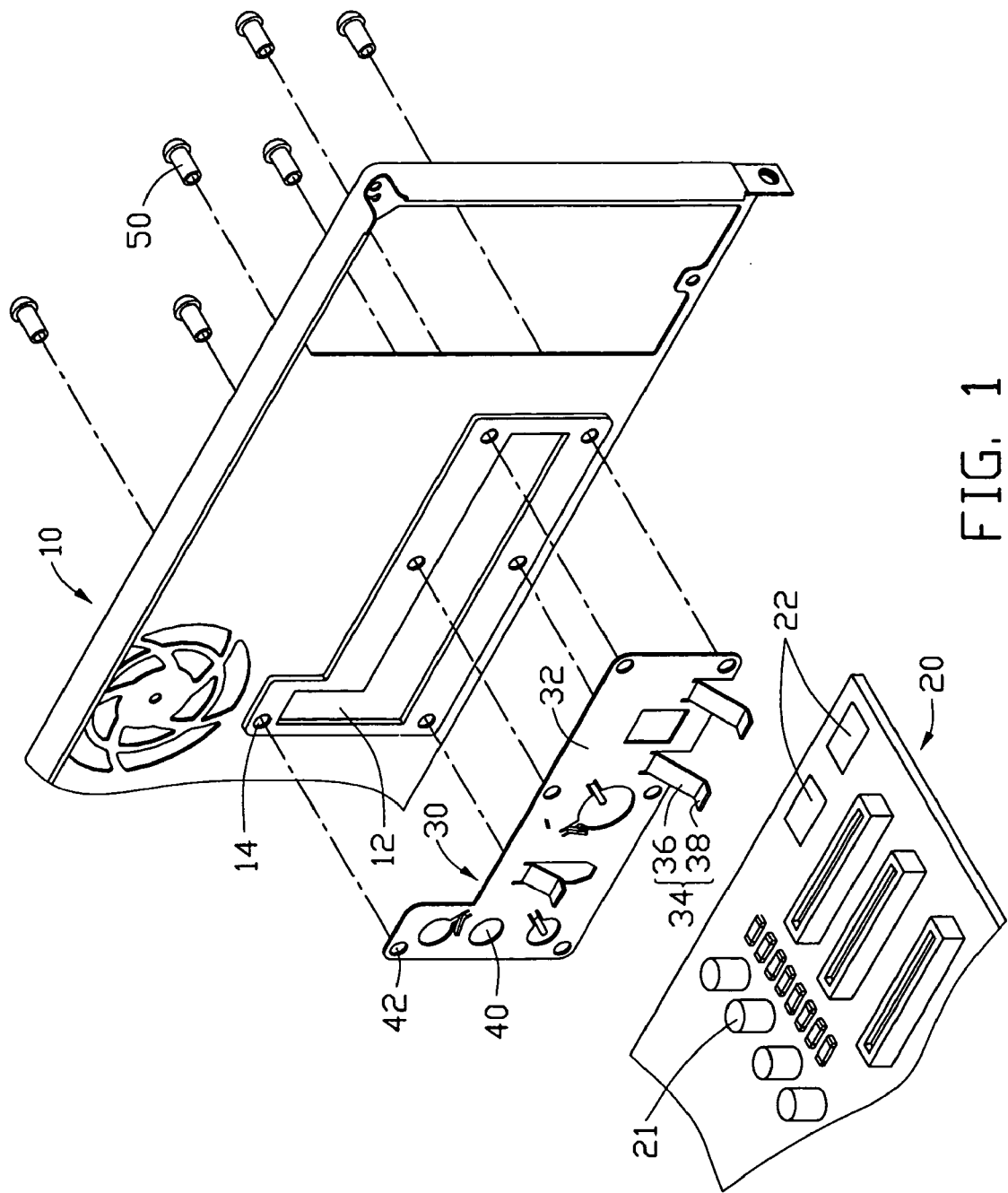
FIG. 1 is an exploded, isometric view of an electronic device with an EMI shield in accordance with a preferred embodiment of the present invention.

Referring to FIG. 1, an electronic device like a personal computer in accordance with a preferred embodiment of the present invention includes a chassis, a board-like circuit assembly 20, and an EMI shield 30.

The enclosure includes a panel 10. The panel 10 defines an opening 12. A plurality of mounting holes 14 is defined in the panel 10 along sides of the opening 12.

The circuit board 20 includes a plurality of electronic components 21 mounted thereon. A pair of copper foils 22 is mounted to the circuit board 20 and electrically connected with earth contacts of the circuit board 20 so as to perform as a ground means.

The EMI shield 30 includes a body 32 sized substantially same as the opening 12 of the panel 10 for covering the opening 12 of the panel 10, and a pair of elastic tabs 34 extending from the body 32. The tabs 34 extend oppositely to the panel 10. Each tab 34 includes an arm 36 extending slantingly from the body 32, and a contacting portion 38 bent from a distal end of the arm 36. A plurality of through holes 40 is defined in the body 32 for input/output ports (not shown). A plurality of securing holes 42 is defined on sides of the body 32.

Figure 2:
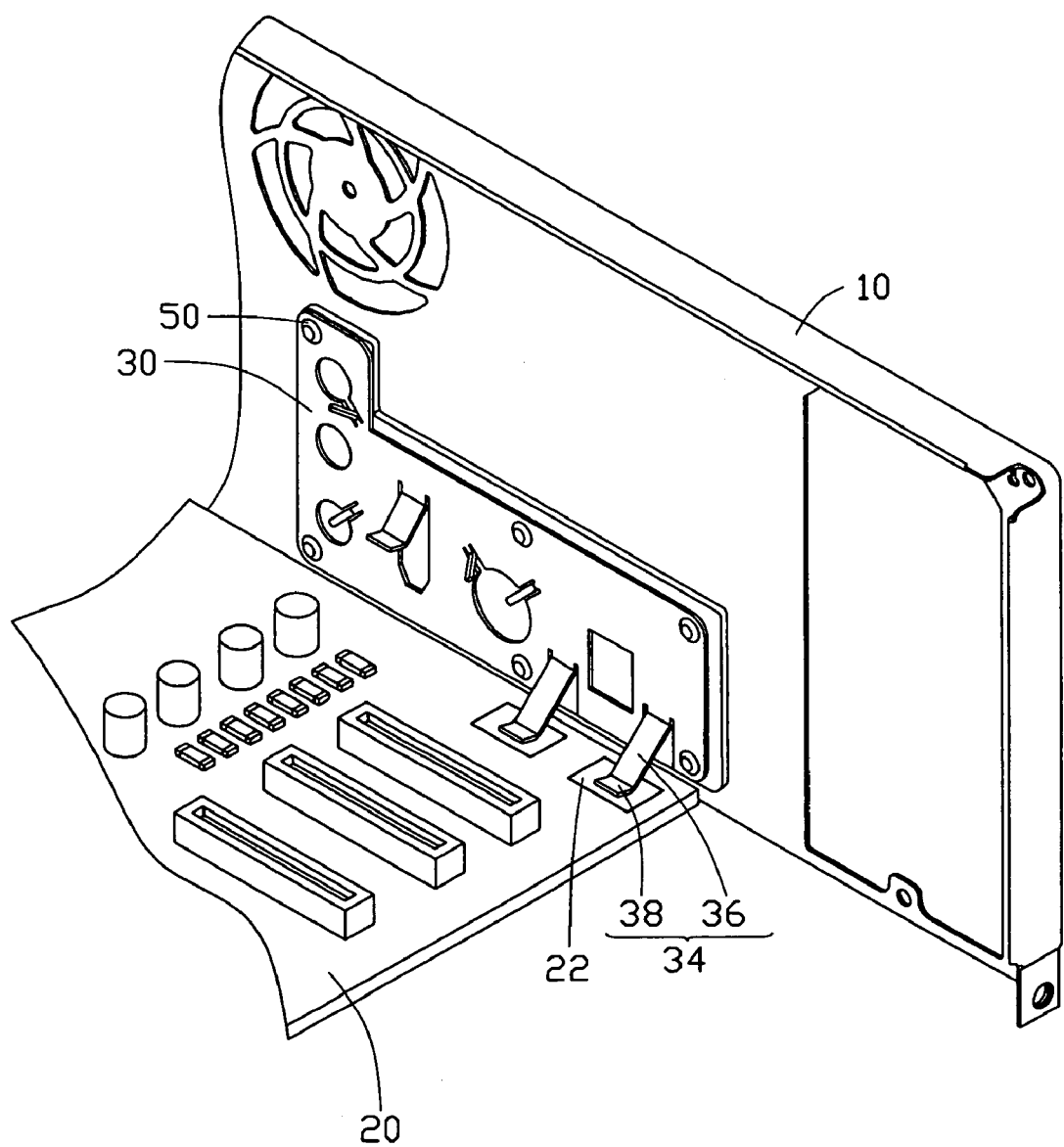
FIG. 2 is an assembled view of FIG. 1.

Referring also to FIG. 2, in assembly, the circuit board 20 is located perpendicularly to the panel 10 and adjacent a lower portion of the panel 10. The EMI shield 30 is placed on a surface of the panel 10 facing the circuit board 20, with the securing holes 42 of the EMI shield 30 aligning with the corresponding mounting holes 14 of the panel 10. A plurality of rivets 50 is extended through the corresponding mounting holes 14 and the corresponding securing holes 42 to fix the EMI shield 30 to the panel 10. The contacting portions 38 of the tabs 34 are situated on the corresponding copper foils 22 to electrically contact with the earth contacts of the circuit board 20.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment of the invention.

I claim:

1. An electronic device comprising:
    a panel;
    a circuit board comprising a copper foil electrically connected to earth contacts thereof; and
    an electromagnetic interference (EMI) shield electrically connected to the panel comprising a tab extending therefrom, and the tab elastically depending from and electrically connected to the copper foil of the circuit board, the EMI shield shielding the circuit board from EMI.

2. The electronic device as claimed in claim 1, wherein the EMI shield comprises a body mounted to the panel, the tab extends from the body.

3. The electronic device as claimed in claim 2, wherein the tab comprises an elastic arm extending slantingly from the body, and a contacting portion bent from a distal end of the arm, the contacting portion electrically contacts with the copper foil.

4. The electronic device as claimed in claim 2, wherein the panel defines an opening, and the body of the EMI shield covers the opening.

5. The electronic device as claimed in claim 4, wherein the body of the EMI shield defines a plurality of through holes for input/output ports.

6. The electronic device as claimed in claim 4, wherein a plurality of mounting holes is defined in the panel, and a plurality of securing holes corresponding to the mounting holes is defined in the EMI shield.

7. An electronic device comprising:
    a panel of said electronic device extending along a side of said electronic device for partially enclosing said electronic device, an opening defined in said panel for access into said electronic device;
    a circuit assembly installable in said electronic device beside said opening of said panel so as to expose components mountable on said circuit assembly along an edge thereof through said opening, a ground means defined on said circuit assembly spaced from said edge thereof; and
    an electrically conductive shield installable between said opening of said panel and said edge of said circuit assembly so as to shield said circuit assembly from electromagnetic interference (EMI), said shield comprising at least one tab extendable toward said ground means of said circuit assembly and engagable with said ground means to establish a direct ground path between said panel and said circuit assembly through said shield.

8. The electronic device as claimed in claim 7, wherein said at least one tab extends slantingly relative to said shield to reachably engage with said ground means.

9. The electronic device as claimed in claim 7, wherein said ground means is a copper foil electrically connected to earth contacts of said circuit assembly.

10. The electronic device as claimed in claim 1, wherein said copper foil is spaced from an edge adjacent the panel of the circuit board.

11. The electronic device as claimed in claim 7, wherein said shield comprises a body sized substantially same as said opening of said panel, said body defines a plurality of through holes for input/output ports of said circuit assembly.

12. The electronic device as claimed in claim 7, wherein a plurality of mounting holes is defined in said panel, and a plurality of securing holes corresponding to said plurality of mounting holes is defined in said shield.

13. An electronic device comprising:

a panel;

a circuit board comprising a copper foil electrically connected to earth contacts thereof; and an electromagnetic interference (EMI) shield electrically connected to the panel comprising a tab extending therefrom, and the EMI shield electrically connected to the copper foil of the circuit board;

wherein the EMI shield comprises a body mounted to the panel, the tab extends from the body, the panel defines an opening, and the body of the EMI shield covers the opening, the body of the EMI shield defines a plurality of through holes for input/output ports.

* * * * *